United States Patent

Grünwald et al.

[11] Patent Number: 6,007,875
[45] Date of Patent: Dec. 28, 1999

[54] METHOD AND APPARATUS FOR APPLYING PROTECTIVE COATINGS ON REFLECTIVE LAYERS

[75] Inventors: Heinrich Grünwald, Niddatal; Michael Jung, Alzenau; Wilfried Dicken, Wächtersbach; Stefan Kunkel; Klaus Nauenburg, both of Hanau, all of Germany

[73] Assignee: Leybold Systems GmbH, Hanau, Germany

[21] Appl. No.: 09/020,715

[22] Filed: Feb. 9, 1998

[51] Int. Cl.$^6$ ............................................. C08J 7/18
[52] U.S. Cl. ................... 427/489; 427/162; 427/255.23; 427/255.6; 427/255.7; 427/294; 427/407.1; 427/488; 427/569; 427/578
[58] Field of Search ...................... 427/489, 488, 427/162, 255.23, 255.6, 255.7, 294, 407.1, 569, 578

[56] References Cited

FOREIGN PATENT DOCUMENTS

| | | |
|---|---|---|
| 0279895 | 8/1988 | European Pat. Off. |
| 0394661 | 10/1990 | European Pat. Off. |
| 0394662 | 10/1990 | European Pat. Off. |
| 0533044 | 3/1993 | European Pat. Off. |
| 3002643 | 9/1981 | Germany . |
| 4010663 | 10/1991 | Germany . |
| 4120176 | 2/1992 | Germany . |
| 4310258 | 10/1994 | Germany . |
| 4412674 | 8/1995 | Germany . |
| 19602634 | 8/1996 | Germany . |

Primary Examiner—Bernard Pianalto

[57] ABSTRACT

A process for applying a protective coating on the reflective layer of projector reflectors by means of plasma polymerization is provided, where a first protective layer which was applied on the reflective layer in a vacuum chamber by plasma polymerization of an organic silicon compound, is provided by means of a plasma in the same processing chamber, under uninterrupted vacuum conditions, with a second, hydrophilic layer substantially composed of a hydrocarbon skeleton and polar functional groups linked thereto, use is made of an apparatus which comprises a plurality of treatment stations (8, 9, 10) held by a fixed, circular cylindrical vacuum chamber wall (16) and a rotatable inner wall cylinder (17) which is enclosed by said vacuum chamber wall (16) and which holds four substrate chambers (12 through 15) and where the wall of the vacuum chamber (16) is provided with four openings (3 through 6) with which the substrate chambers (3 through 6) can be aligned and through which openings the treatment material can act upon the substrates (2, 2', . . . ), with an outer wall (21, 21', . . . ) which encloses the vacuum chamber wall (16) from the outside and extends radially outward from said vacuum chamber wall (16) and joins together the three treatment stations (8, 9, 10) and the loading/unloading station (11), where at least one of the outer chambers (17 through 20) provided between the outer wall, the vacuum chamber wall and the treatment stations (8, 9, 10) is connected on the one hand with the adjoining treatment station and on the other hand with a gas source or an initial substance source (30 through 33).

18 Claims, 1 Drawing Sheet

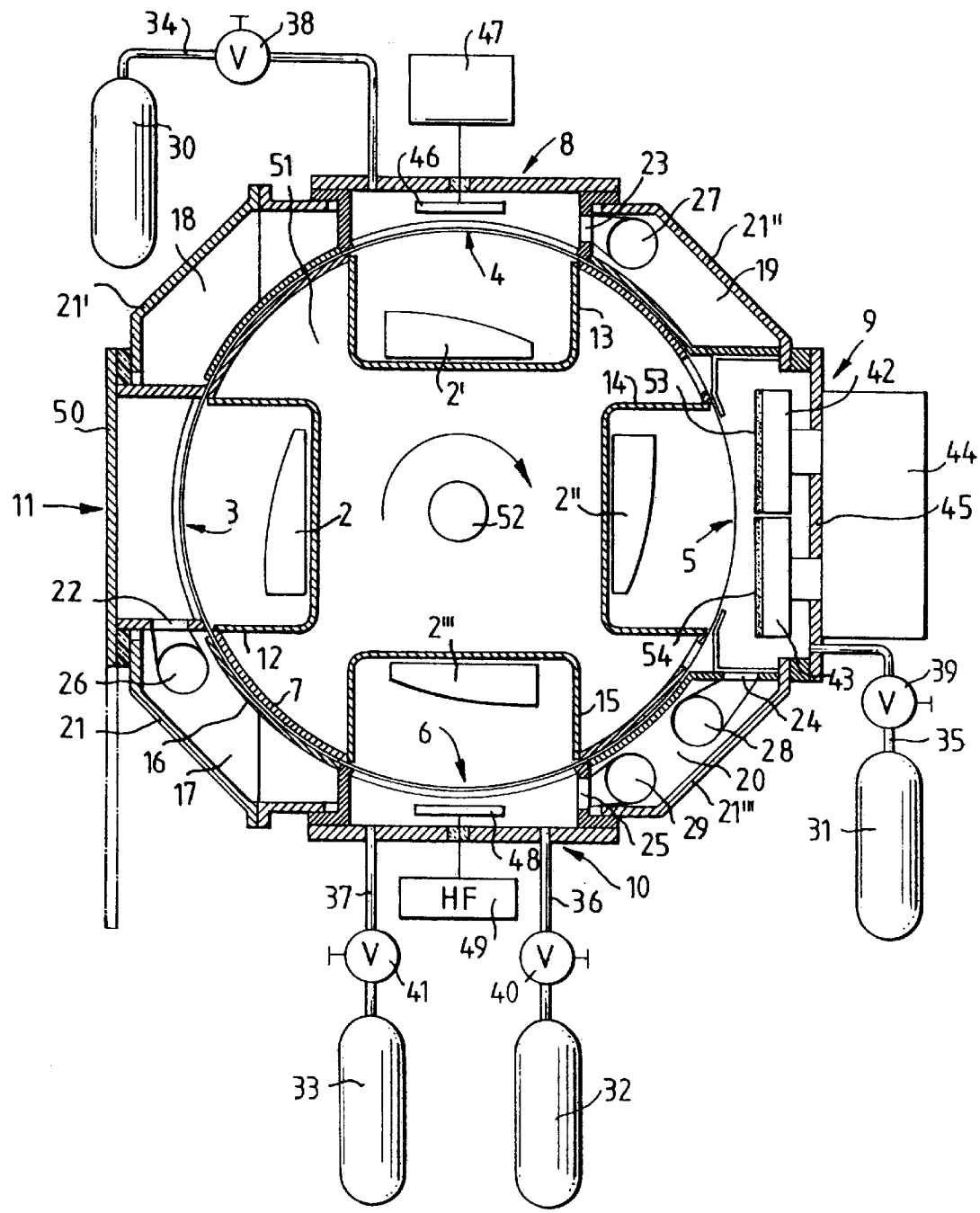

METHOD AND APPARATUS FOR APPLYING PROTECTIVE COATINGS ON REFLECTIVE LAYERS

FIELD OF THE INVENTION

The invention concerns a method for applying anti-fogging coatings on corrosion-protective layers over reflective coatings of projector reflectors by means of plasma polymerization, and an apparatus therefor.

DISCUSSION OF THE PRIOR ART

A process is known for the protective coating of substrates by means of plasma polymerization with at least one gaseous silicon-organic compound, where plasma is produced in a vacuum chamber and a gas containing said compound is fed into the chamber in order to produce the coating, where the plasma is produced by means of an amplitude modulated electromagnetic alternating field and where the coating rate is set, by means of at least one of the process parameters which control said rate, at such a level that when the amplitude modulation of the electromagnetic alternating field is arrested and its modulation is held constant at maximum modulation, the resulting protective coating exhibits substantial powdery portions (EP 0 533 044). This known process is especially suitable for producing protective coatings at the highest possible coating rate in a largely maintenance free operation.

The above process has the disadvantage that is does not prevent fogging of the reflective layer due to air humidity and/or vapors from the projector reflector material.

The process according to DE 26 25 448 proposes a remedy in form of a subsequent hydrophilic treatment of the protective coating by means of oxygen plasma. In-house experiments have shown however that the anti-fogging effect is limited. Of even greater disadvantage is the fact that the oxygen plasma treatment can decisively inhibit the anti-corrosion effect of the protective layer. Therefore state of the art production technology employs an special vapor deposition device to deposit a hydrophilic layer of silicon oxide subsequent to the production of the corrosion-protective coating (by means of plasma polymerization). This significantly increases the cost of the equipment, especially in rapid rate, continuous operation, multiple chamber installations because an additional processing chamber must be provided.

SUMMARY OF THE INVENTION

The object of the present invention is therefore to describe a method and apparatus which makes it possible to apply highly effective anti-fogging hydrophilic layers on polymerized protective coatings of the kind described above, without negatively affecting their anti-corrosion effect. In doing so, detrimental optical effects, such as measurable visible-light absorption or interference colors, must not occur. In addition, for economic reasons, the method is to be applied using the same apparatus is in which the protective layer was produced. Furthermore, the process and apparatus should be suitable for continuous operation in short (typically <1 min) cycle production lines.

According to the invention the object is attained by a process wherein a reflective coating (typically vapor deposited or sputtered aluminum) which has been coated with an anti-corrosion layer by means of plasma polymerization, is provided, in an additional processing step, with a second, anti-fogging hydrophilic coating, said coating primarily consisting of a hydrocarbon skeleton with polar functional groups linked thereto, deposited by means of plasma, under uninterrupted vacuum conditions in the same vacuum chamber.

In accordance with the state of the art the initial substance used for the plasma-polymerized anti-corrosion layer is, typically, hexamethyl disiloxane or another related silicon-organic compound that is sufficiently vaporizable.

According to the invention the hydrophilic anti-fogging layer can be produced by three process variants:

Process variant 1a:

Production of the anti-fogging layer is accomplished by means of plasma polymerization, using at least one initial substance which is substantially composed of a hydrocarbon portion and at least one electronegative (i.e., consisting substantially of electronegative elements) functional group. The hydrocarbon portion can be aliphatic, cyclo-aliphatic, aromatic or heterocyclic. The following electronegative functional groups may be provided: halogen groups (—F, —Cl, —Br), sulfide groups (—SO, sulfoxy groups (=SO—), sulfone groups (=$SO_2$), amino groups (particularly-$NH_2$ or =NH, also as a cyclic compound), ester groups (—COOR—), ether groups (C—O—C, also as cyclic compounds, for example oxirane), preferably carboxy (—COOH), carbonyl groups (=C=O), nitrile groups (—CN), especially preferred being nitro groups (—$NO_2$), amido groups (—$CONH_2$) or hydroxy groups (—OH).

Examples of suitable initial substances are: formic acid, acetic acid, propionic acid, acrylic acid, acetaldehyde, propionaldehyde, butyraldehyde, i-butyraldehyde, methanol, ethanol, n-propanol, i-propanol, butanol-1, butanol-2, i-butanol, t-butanol, 2-methyl-2-propenol, formamide, acetonitrile, acrylonitrile, ethyl acetate, crotonic acid methyl ester, dioxane, tetrahydrofurane, nitromethane and nitroethane.

Process variant 1b:

Production of the anti-fogging layer is accomplished by means of plasma polymerization, using at least one initial substance which is substantially composed of a hydrocarbon portion and one or more additional electronegative elements (halogens, but preferably oxygen or nitrogen). The hydrocarbon compounds used can be open chain or cyclic alkanes, alkines or aromatics, but preferred are open chain or cyclic alkenes. According to the invention, additionally used compounds are $O_2$, $CO_2$, $H_2O$, $N_2$, $N_2O$, $NH_3$ or a mixture of these compounds, in the simplest case for example air.

Examples of mixtures which can be used in accordance with the invention are: ethylene+$O_2$, acetylene+$H_2O$ or cyclopentene+$N_2O$.

It is also possible, according to the invention, to use an initial substance from the variant 1a with a hydrocarbon compound, or else with an electronegative additional compound according to 1b, together in a plasma polymerization process.

It is further possible, in keeping with conventional plasma technological practice, to add a rare gas to the plasma in the two above process variants in order to beneficially influence the properties of the plasma and/or coatings.

Process variant 2:

Production of the anti-fogging layer is accomplished by means of plasma-induced polymerization. This process is based on the reaction of suitable compounds with radical sites on the surface of the anti-corrosive layer. As is known, these radicals are produced by plasma action on polymer surfaces. In the production of the anti-corrosive layer, radicals are continuously produced on and in the growing layer during the plasma polymerization, continue to be present even after the process is finished, and continue to react thereafter. However, even after the plasma polymerization, radicals can be produced in and on the plasma polymer layer by a separate, short, nitrogen or rare gas, plasma treatment, and these radicals react in the same manner.

According to the invention, upon termination of such rare gas plasma treatment, or preferably directly after the plasma polymerization of the anti-corrosive layer, the treatment chamber is charged with one or more aliphatic, cycloaliphatic, heterocyclic or aromatic initial substances, each with at least one electronegative functional group and, additionally, with at least one polymerizable functional group.

According to the invention, especially suitable polymerizable groups are C=C double bonds, epoxy groups or thiamine groups. When initial substances containing epoxy groups are used, polar functional groups are formed by the reaction with the radicals, so that in case of relatively low demands regarding the hydrophilicity of the layer, separate electronegative groups can be dispensed with in this case. Otherwise, the following electronegative functional groups can be employed: halogen groups (—F, —Cl, —Br), sulfoxy groups (=SO—), sulfone groups (=SO$_2$), amino groups (especially —NH$_2$), but preferably carboxy (—COOH), carbonyl groups (=C=O), nitrile groups (—CN), especially preferred being nitro groups (—NO$_2$), amido groups (—CONH$_2$) or hydroxy groups (—OH).

Examples of initial substances to be used in this process variant are: propylene oxide, acrylonitrile, aflyl-2,3-epoxy propyl ether, 2,3-epoxy propanol, preferably crotononitrile, acrylic acid, 2-butenol and 1-buten-3-ol.

In a typical example, a brief application of an argon plasma is stopped and the reaction chamber is immediately charged with 3-buten-1-ol vapor.

The preferred apparatus for the method has a fixed, nearly cylindrical vacuum chamber wall which holds a plurality of treatment stations, where a rotatably mounted inner cylinder wall carries four substrate chambers and is enclosed by said vacuum chamber wall, where four openings are provided in the wall of said vacuum chamber and where said four openings can be brought into alignment with the substrate chambers and through which openings the treatment material can act on the substrates, where an outer wall encloses the vacuum chamber wall on the outside, extends radially outward from the vacuum chamber wall and joins the three treatment stations and the loading/unloading airlocks together, where at least one of the outer chambers provided between the outer wall, the vacuum chamber wall and the treatment chambers is connected on the one hand with its adjoining treatment station and on the other hand with a gas source or a initial-material source.

Additional particulars and features are described in more detail and characterized in the attached patent claims.

BRIEF DESCRIPTION OF THE DRAWINGS

The invention permits a great variety of embodiments, one of which is illustrated, in a purely schematic manner, in the attached drawing which shows a cross section view of the vacuum treatment apparatus.

DETAILED DESCRIPTION

The apparatus comprises a circular cylindrical vacuum chamber 16 which is provided with several, window-like openings 3 through 6, uniformly distributed on the chamber's mantle, where each opening 3 through 6 is associated with one treatment station 8, 9, 10 or a loading/unloading station 11, each of which stations comprising a box-shaped housing 12 through 15, open on the side facing the respective openings 3 through 6, and whose circumferential edge is rigidly joined with the cylindrical vacuum chamber wall 16. The cylindrical vacuum chamber 16 encloses an inner cylinder 7 having openings which correspond with the abovementioned openings 3 though 6 in the vacuum chamber 16 and into which openings are set the box-shaped substrate chambers 12 through 15, which chambers, together with the treatment stations 8, 9, 10 and/or the loading/unloading station 11 each form receptacles enclosed on all sides when the inner cylinder 7 is in the position shown in the drawing. The circular cylindrical vacuum chamber wall 16 is encompassed by the outer wall parts 21, 21', 21", . . . each of which parts being fixed to the wall parts of the treatment stations 8, 9, 10 and/or the loading/unloading station 11, and thus form, together with the chamber wall 16 the outer chambers 17, 18, 19, 20. All of these outer chambers are connected by bores 22, 23, 24, 25 on the one hand with the treatment stations 8, 9, 10 and/or 11, and on the other hand with vacuum pumps. Furthermore, the treatment stations 8, 9, 10 are connected with gas storage tanks 30, 31, 32, 33, with the connecting lines 34, 35, 36, 37 each having valves 38, 39, 40, 41, by means of which valves the gases can be supplied to the individual treatment stations 8, 9 10 in metered amounts so that for example a glow process or a pre-coating process can be accomplished in station 8 and a coating processes can be accomplished in each of the stations 9 and 10. Two sputter cathodes 42, 43 are mounted in the housing of the treatment station 9 and the necessary electrical supply 44 is fixed to the outer wall 45 of the treatment chamber 9. An electrode (typically designed as a so-called glow cathode) 46 is provided in the treatment station 8 and the electrical supply 47 is connected with the glow cathode. The treatment station 10 is provided with an electrode 48 which is supplied by its own electrical power generator 49. The initial substances can be fed in metered amounts to the station 10 from both storage tanks 32, 33 via lines 36, 37, simultaneously or successively. The cover can be moved into the position indicated by broken lines to permit loading or unloading. All chambers, namely the treatment chambers 8, 9, 10, the airlock chamber 11, the substrate chambers 12, 13, 14, 15, the outer chambers 17, 18, 19, 20 and the inner cylinder 7 are covered by a common floor plate and a top cover plate (not shown), resulting in an especially simple construction of the apparatus. Obviously, the inner cylinder 7 must be rotationally fixed to its own, at least one, circular discoid plate 51, with a motor drive 52, so that the structure formed by the inner cylinder 7 and the substrate chambers 12, 13, 14, 15 can rotate within the actual vacuum chamber.

First, with the cover 50 opened, the substrate 2 is introduced into the substrate chamber 12 and is then, with the cover 50 closed, transported (clockwise) in the direction of the arrow until it is located in front of the cathode 46. When this position is reached, the chamber 13 is evacuated and a glow process takes place after a suitable gas (for example O$_2$) has been fed from the gas tank 30 via the pipe 34 into the treatment station 8, and the surface of the substrate 2 is prepared for the sputter process in the treatment station 9. The aluminum required for the coating is sputtered from the targets 53, 54 after the inner cylinder has been rotated clockwise by 90°, while the required processing gas (argon) is supplied via pipe 35 from the gas tank 31. After the metallizing, the substrate chamber 12 is transported by a quarter turn in the direction of the arrow until the substrate 2 is located opposite electrode 48. The plasma polymerization process takes place in the treatment station 10, for which process a first initial substance, for example hexamethyldisiloxane, is first fed into the treatment chamber 10 from the tank 33 via line 37 by the metering valve 41. The last step in the coating process is the stopping of the gas flow from tank 33 and the simultaneous charging with a second initial substance, for example methanol. Finally, the gas inflow is stopped and the inner cylinder 7 is rotated again by 90° so that the chamber 13 is located in front of the loading/unloading opening 3 and the treated substrate 2 can be replaced by an untreated substrate 2$^x$. Obviously, the process runs continuously, i.e., while one substrate is being coated with a polymerized coating in station 10, a sputter process takes place in station 9, and a glow process is in progress in station 8.

| Reference numbers | |
|---|---|
| 2, 2", ... | Substrate |
| 3 | Window-like opening |
| 4 | Window-like opening |
| 5 | Window-like opening |
| 6 | Window-like opening |
| 7 | Vacuum chamber, inner cylinder |
| 8 | Treatment chamber |
| 9 | Treatment chamber |
| 10 | Treatment chamber |
| 11 | Loading/unloading airlock |
| 12 | Box-shaped substrate chamber |
| 13 | Box-shaped substrate chamber |
| 14 | Box-shaped substrate chamber |
| 15 | Box-shaped substrate chamber |
| 16 | Outer cylinder |
| 17 | Outer chamber |
| 18 | Outer chamber |
| 19 | Outer chamber |
| 20 | Outer chamber |
| 21, 21', ... | Outer wall section |
| 22 | Bore |
| 23 | Bore |
| 24 | Bore |
| 25 | Bore |
| 26 | Pipeline |
| 27 | Pipeline |
| 28 | Pipeline |
| 29 | Pipeline |
| 30 | Storage tank |
| 31 | Storage tank |
| 32 | Storage tank |
| 33 | Storage tank |
| 34 | Gas line |
| 35 | Gas line |
| 36 | Gas line |
| 37 | Gas line |
| 38 | Metering gas valve |
| 39 | Metering gas valve |
| 40 | Metering gas valve |
| 41 | Metering gas valve |
| 42 | Sputter cathode |
| 43 | Sputter cathode |
| 44 | Electrical power supply |
| 45 | Outer wall |
| 46 | Glow cathode |
| 47 | Electrical power supply |
| 48 | Electrode |
| 49 | Power generator, HF source |
| 50 | Cover |
| 51 | Circular discoid plate |
| 52 | Motor drive |
| 53 | Target |
| 54 | Target |

What is claimed is:

1. A method for applying protective coatings on a reflective layer of a projector reflector by means of plasma polymerization in a processing chamber under a vacuum condition, said method comprising:
   applying a first protective layer on the reflective layer in a vacuum chamber by plasma polymerization of an organic silicon compound,
   coating the reflector, by means of a plasma, in the same processing chamber without interrupting said vacuum condition, with a second, hydrophilic, layer composed of a hydrocarbon skeleton with polar functional groups linked thereto.

2. Method according to claim 1 wherein the production of the hydrophilic layer by plasma polymerization is accomplished using at least one initial substance, where the initial substance is composed of a hydrocarbon portion and at least one electronegative functional group substantially composed of electronegative components.

3. Method according to claim 2, wherein the electronegative functional groups are selected from the group consisting of halogen (—F, —Cl, —Br), sulfide (—SO), sulfoxy (=SO—), sulfone (=SO$_2$), amino, ester (—COOR—), ether, carboxy (—COOH), carbonyl (=C=O), nitrile (—CN), nitro (—NO$_2$), amido (—CONH$_2$) and hydroxy (—OH) moeities.

4. Method according to claim 2, wherein the amino moeities include —NH$_2$, =NH, and cyclic amino moeities.

5. Method according to claim 2, wherein the ether moeities include cyclic compounds, including oxirane.

6. Method according to claim 1 wherein the electronegative groups used are selected from the group consisting of halogen (—F, —Cl, —Br), amino, sulfoxy (=SO), sulfone (=SO$_2$), carboxy (—COOH), carbonyl (—C=O), nitrile (—CN), nitro (—NO$_2$), amido (—CONH$_2$) and hydroxy (—OH) moeities.

7. Method according to claim 1, wherein the hydrocarbon portion is aliphatic, cycloaliphatic or heterocyclic.

8. Method according to claim 1, wherein the production of the hydrophilic layer is accomplished by plasma polymerization using a mixture of at least one hydrocarbon compound and an additional compound which is substantially composed of one or several electronegative components selected from the group consisting of halogens, oxygen and nitrogen.

9. Method according to claim 8 wherein the utilized hydrocarbon compounds are open-chain or cyclic alkanes, alkynes or aromatics.

10. Method according to claim 8 wherein the utilized hydrocarbon compounds are open-chain or cyclic alkenes.

11. Method according to claim 8 wherein the additional compound is composed of elements selected from the group consisting of $O_2$, $CO_2$ $H_2$, O, $N_2$, $N_2O$, and mixtures thereof, including air.

12. Method according to claim 1, wherein the formation of the hydrophilic layer is accomplished by plasm-induced polymerization so that immediately upon termination of a preceding plasma, one or more aliphatic, cycloaliphatic or aromatic initial substances with at least one polymerizable functional group are introduced into the processing chamber.

13. Method according to claim 1 wherein the plasma preceding the plasma-induced polymerization is the same as the plasma used for the plasma polymerization of the protective layer.

14. Method according to claim 1 wherein the plasma preceding the plasma-induced polymerization is a short-term nitrogen or rare gas plasma.

15. Method according to claim 1 wherein the polymerizable groups used are selected from the group consisting of C=C double bonds, epoxy, and thiamine moeities.

16. Method according to claim 2 wherein, when initial substances containing epoxy groups are used, the initial substances do not contain separate electronegative groups.

17. Method according to claim 16 wherein the amino moiety is —NH$_2$.

18. Method according to claim 1 wherein the electronegative groups used are selected from the group consisting of carboxy (—COOH), carbonyl (—C=O), nitrile (—CN), nitro (—NO$_2$), amido (—CONH$_2$) and hydroxy (—OH) moeities.

* * * * *

UNITED STATES PATENT AND TRADEMARK OFFICE
CERTIFICATE OF CORRECTION

PATENT NO. : 6,007,875
DATED : December 28, 1999
INVENTOR(S) : Grünwald et al.

It is certified that error appears in the above-indentified patent and that said Letters Patent is hereby corrected as shown below:

In column 3, line 9, change "thiamine" to read as - - thiirane - -.
In column 3, line 21, change "aflyl-2,3-epoxy" to read as - - allyl-2,3-epoxy - -.

In column 6, line 40, change "plasm-induced" to read as - - plasma-induced - -.
In column 6, line 53, change "thiamine" to read as - - thiirane - -.

Signed and Sealed this

Third Day of April, 2001

Attest:

NICHOLAS P. GODICI

Attesting Officer     Acting Director of the United States Patent and Trademark Office